(12) United States Patent
Le et al.

(10) Patent No.: US 6,750,156 B2
(45) Date of Patent: Jun. 15, 2004

(54) METHOD AND APPARATUS FOR FORMING AN ANTI-REFLECTIVE COATING ON A SUBSTRATE

(75) Inventors: Hien-Minh Huu Le, San Jose, CA (US); Hoa Thi Kieu, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/083,725

(22) Filed: Oct. 24, 2001

(65) Prior Publication Data

US 2003/0077914 A1 Apr. 24, 2003

(51) Int. Cl.$^7$ .......................... H01L 21/31; C23C 14/08
(52) U.S. Cl. ..................................... 438/785; 204/192.1
(58) Field of Search ................. 438/763, 769, 438/770, 785; 204/192.1, 192.13, 192.22, 192.26, 192.27, 192.28

(56) References Cited

U.S. PATENT DOCUMENTS

| | | | |
|---|---|---|---|
| 4,200,474 A | 4/1980 | Morris | |
| 4,980,749 A | 12/1990 | Ohtsuka et al. | |
| 5,015,353 A | 5/1991 | Hubler et al. | |
| 5,055,169 A | 10/1991 | Hock, Jr. et al. | |
| 5,196,958 A | 3/1993 | Verbeek et al. | |
| 5,286,608 A | 2/1994 | Koh | |
| 5,454,919 A | 10/1995 | Hill et al. | |
| 5,514,908 A | 5/1996 | Liao et al. | |
| 5,561,326 A | 10/1996 | Ito et al. | |
| 5,652,431 A | 7/1997 | DeSisto et al. | |
| 5,729,323 A | 3/1998 | Arden et al. | |
| 5,851,364 A | 12/1998 | Fu et al. | |
| 5,907,766 A | 5/1999 | Swanson et al. | |
| 5,907,784 A | 5/1999 | Larson | |
| 5,942,089 A | 8/1999 | Sproul et al. | |
| 6,046,081 A | 4/2000 | Kuo | |
| 6,051,114 A | 4/2000 | Yao et al. | |
| 6,052,176 A | 4/2000 | Ni et al. | |
| 6,071,055 A | 6/2000 | Tepman | |
| 6,074,730 A | 6/2000 | Laird et al. | |
| 6,144,097 A | 11/2000 | Asahina et al. | |
| 6,156,606 A | 12/2000 | Michaelis | |
| 6,159,297 A | 12/2000 | Herchen et al. | |
| 6,174,644 B1 | 1/2001 | Shieh et al. | |
| 6,183,614 B1 | 2/2001 | Fu | |
| 6,224,638 B1 | 5/2001 | Jevtic et al. | |
| 6,266,193 B1 | 7/2001 | Saif et al. | |
| 6,274,008 B1 | 8/2001 | Gopalraja et al. | |

OTHER PUBLICATIONS

Dielectric Material Integration for Microelectronics, Pennington, NJ: Electrochem. Soc, 1998. p. 227–240. Conference: San Diego, CA, 1998.*

* cited by examiner

Primary Examiner—Evan Pert
Assistant Examiner—Lisa Kilday
(74) Attorney, Agent, or Firm—Ashok K. Janah

(57) ABSTRACT

In a method of depositing a titanium oxide layer on a substrate, a substrate is placed on a support in a process zone of a sputtering chamber. A target containing titanium faces the substrate. A sputtering gas containing an oxygen-containing gas, such as oxygen, and a non-reactive gas, such as argon, is introduced into the process zone. A pulsed DC voltage is applied to the target to sputter titanium from the target. The sputtered titanium combines with oxygen from the oxygen-containing gas to form a titanium oxide layer on the substrate. A multiple layer titanium oxide deposition process may also be implemented.

36 Claims, 4 Drawing Sheets

METHOD AND APPARATUS FOR FORMING AN ANTI-REFLECTIVE COATING ON A SUBSTRATE

BACKGROUND

The present invention relates to the processing of an anti-reflective coating on a substrate.

In electronic circuit fabrication, an interconnect feature, such as a wiring line or a contact plug, is used to electrically connect electronic features that are formed on a substrate. The interconnect feature is typically formed by depositing on the substrate, stacked layers comprising, for example, a diffusion barrier layer, an electrical conductor layer, and an anti-reflective coating. The diffusion barrier layer reduces the inter-diffusion of underlying substrate materials to the overlying layers, the electrical conductor layer comprises an electrically conducting metal or metal compound, and the anti-reflective coating reduces the reflectivity of the underlying conductor layer to allow more accurate patterning of a mask that may be formed on the stacked layers for etching. After the patterned mask is formed, by for example, photo or electron beam lithographic processes, the unprotected portions of the stacked layer are etched to form a pattern of interconnects on the substrate. A dielectric layer, such as silicon dioxide, may also be deposited over the interconnects for their electrical isolation. The interconnects may also be formed by sequentially depositing these or other materials into contact holes that are etched in the substrate.

In one configuration, the diffusion barrier layer below the conductor layer, includes amongst other layers, a titanium oxide layer. Such a titanium oxide layer is typically formed by sputter depositing elemental titanium metal on the substrate in a PVD chamber, and thereafter, transferring the substrate to an oxidizing chamber to oxidize the titanium by heating it in an oxygen environment to form titanium oxide, as for example, disclosed in U.S. Pat. No. 6,144,097, which is incorporated herein by reference in its entirety. However, it is difficult to control the stoichiometry of the titanium oxide layer formed by this method throughout the thickness of the layer, and often, the oxidized titanium oxide layer can have a variable stoichiometry through its thickness. Thus, it is desirable to find other ways of forming a titanium oxide layer having a more controllable composition.

After forming the diffusion barrier layer, a conductor layer, such as aluminum or copper layer, is deposited on the diffusion barrier layer, to serve as an electrically conducting layer. The conductor layer is typically formed by conventional PVD methods. Then, an anti-reflective coating is formed on the conductor layer, typically by chemical vapor deposition (CVD) and physical vapor deposition (PVD) processes that are sequentially performed in both CVD and PVD chambers, respectively. For example, an anti-reflective coating comprising a titanium metal layer and a titanium nitride layer (TiN), may be formed by sputter depositing the two layers in PVD chambers. Such an anti-reflective coating typically provides a surface reflectivity of about 60% as compared to a 100% reflectivity of a bare silicon wafer. The surface reflectivity may be improved by depositing $SiO_2$ and/or SiON layers over the TiN layer to reduce the surface reflectivity to less than about 10%. However, typically, the $SiO_2$ and SiON layers are deposited by chemical vapor deposition processes performed in CVD chambers. This requires the substrate to be transferred from a PVD chamber to a CVD chamber, which increases processing time and potentially reduces substrate yields through contamination during the transferring step.

A further problem arises from the out-gassing of gaseous species from the chamber walls during the film formation step. The chamber walls may retain species, such a hydrogen gas, from prior processing steps performed in the chamber. Such gaseous species may combine with other gases that are used in the processing step to form undesirable byproducts in the chamber that affect the quality of the film being formed on the substrate or that may result in other adverse effects. For example, out-gassed hydrogen can combine with oxygen to form water vapor which hinders the high vacuum pumping system that exhausts the gases from the chamber.

Thus, it is also desirable to be able to fabricate an anti-reflective coating having a low reflectivity in a sequence of steps that may be performed in a single chamber such as, for example, a PVD chamber, to provide increased process throughput and higher substrate yields. It is further desirable to have an anti-reflective coating having a surface reflectivity of, for example, less than 10% to, for example, improve the accuracy and resolution of lithographic processes that are performed to pattern a mask formed on the substrate. It is also desirable to have an apparatus that can accommodate for the out-gassing of undesirable gaseous species in the chamber.

SUMMARY

A method of depositing titanium oxide on a substrate, the method comprising:
(a) placing a substrate in a process zone;
(b) applying a pulsed DC voltage to a target facing the substrate, the target comprising titanium; and
(c) maintaining a sputtering gas at a sub atmospheric pressure in the process zone, the sputtering gas comprising an oxygen-containing gas,
whereby titanium oxide is deposited on the substrate.

A method of sputter depositing material on a substrate in a multi-chamber platform comprising first and second sputtering chambers, the method comprising:
(a) in a diffusion barrier deposition stage, forming a diffusion barrier layer on a substrate;
(b) in a conductor deposition stage, transferring the substrate to a support in the first sputtering chamber, providing a target comprising conductor material facing the substrate, and maintaining an energized sputtering gas at a sub atmospheric pressure in the process zone, whereby conductor material that is sputtered from the target is deposited onto the substrate to form a conductor layer; and
(c) in an anti-reflective coating deposition stage, transferring the substrate to a support in a second sputtering chamber, applying a pulsed DC voltage to a target comprising titanium facing the substrate, and maintaining a sputtering gas at a sub atmospheric pressure in the process zone, the sputtering gas comprising oxygen and argon, whereby titanium that is sputtered from the target combines with the oxygen to form an anti-reflective coating of titanium oxide on the substrate.

A method of sputter depositing a stacked layer on a substrate in a multi-chamber platform comprising a load-lock chamber and first and second sputtering chambers, the method comprising:
(a) placing a plurality of substrates in the load-lock chamber;
(b) in a diffusion barrier deposition stage, forming a diffusion barrier layer on one of the substrates;
(c) in a conductor deposition stage, (i) transferring the substrate to a support in the first sputtering chamber, (ii)

providing a target facing the substrate, the target comprising a conductor material, (iii) maintaining an energized sputtering gas at a sub atmospheric pressure in the process zone, whereby conductor material that is sputtered from the target is deposited on the substrate; and (d) in an anti-reflective coating stage, (i) transferring the substrate to a support in the second sputtering chamber, (ii) providing a target comprising titanium facing the substrate, (iii) applying a pulsed DC voltage to the target, the pulsed DC voltage having a frequency of from about 50 kHz to about 300 kHz and being pulsed so that the voltage is off from about 5% to about 50% of the time of each pulse cycle, and (iv) maintaining a sputtering gas at a sub atmospheric pressure in the process zone, the sputtering gas comprising a volumetric flow ratio of oxygen to argon of from about 4:1 to about 9:1, whereby titanium that is sputtered from the target combines with the oxygen to form an anti-reflective coating of titanium oxide on the substrate.

A sputtering chamber for depositing titanium oxide on a substrate, the chamber comprising:

a substrate support;

a target facing the substrate support, the target comprising titanium;

a pulsed DC source to provide a pulsed DC voltage to the target;

a gas inlet to introduce a sputtering gas into the chamber, the sputtering gas comprising an oxygen-containing gas; and an exhaust to exhaust the sputtering gas.

A sputtering chamber for depositing titanium oxide on a substrate, the chamber comprising:

a substrate support;

a target facing the substrate support, the target comprising titanium;

a pulsed DC source to apply a pulsed DC voltage to the target;

a sputtering gas supply comprising an oxygen input to receive oxygen from an external source and an argon input to receive argon from another external source, and mass flow controllers adapted to control the oxygen and argon flow rates from the inputs into the chamber;

an exhaust to exhaust gas from the chamber; and a controller comprising a computer having computer readable program code embodied in a computer readable medium, the computer readable program code comprising:

voltage source program code to operate the pulsed DC source to apply the pulsed DC voltage to the target; and gas flow program code to operate the mass flow controllers to control the gas flow rates to maintain a volumetric flow ratio of oxygen to argon of from about 4:1 to about 9:1, whereby titanium that is sputtered from the target and the oxygen combine to deposit titanium oxide on the substrate.

An apparatus for depositing material on a substrate, the apparatus comprising:

a platform that interconnects a plurality of chambers so that a substrate may be transferred from one chamber to another chamber;

a load-lock chamber on the platform to receive a cassette of substrates;

a first sputtering chamber mounted on the platform, the first sputtering chamber comprising (i) a substrate support, (ii) a target facing the substrate support, the target comprising a conductor material, (iii) a gas inlet to provide a gas into the chamber, (iv) a gas energizer to energize the gas, and (v) an exhaust to exhaust the gas, whereby conductor material is sputtered from the target and onto the substrate; and a second sputtering chamber mounted on the platform, the second sputtering chamber comprising (i) a substrate support, (ii) a target facing the substrate support, the target comprising titanium, (iii) a pulsed DC source to bias the substrate support with a pulsed DC voltage, (iv) a gas inlet to introduce a gas into the chamber, the gas comprising an oxygen-containing gas and argon, and (v) an exhaust to exhaust the gas, whereby titanium that is sputtered from the target and the oxygen-containing gas combine to deposit titanium oxide on the substrate.

A method of depositing titanium oxide on a substrate, the method comprising:

(a) placing a substrate in a process zone;

(b) electrically biasing a target facing the substrate, the target comprising titanium;

(c) introducing a sputtering gas into the process zone, the sputtering gas comprising a first volumetric flow ratio of an oxygen-containing gas and argon;

(d) changing the first volumetric flow ratio to a second volumetric flow ratio;

(e) exhausting the sputtering gas, whereby multiple layers of titanium oxide are deposited on the substrate.

A sputtering chamber for depositing titanium oxide on a substrate, the chamber comprising:

a substrate support;

a target facing the substrate support, the target comprising titanium;

a voltage source to apply a voltage to the target;

a sputtering gas supply comprising an oxygen input to receive an oxygen-containing gas from an external source and an argon input to receive argon from another external source, and mass flow controllers adapted to control the oxygen-containing gas and argon flow rates from the inputs into the chamber;

an exhaust to exhaust gas from the chamber; and a controller comprising a computer having computer readable program code embodied in a computer readable medium, the computer readable program code comprising gas flow program code to operate the mass flow controllers to control the gas flow rates to provide a sputtering gas comprising first volumetric flow ratio of oxygen-containing gas to argon for a first time period, and a second volumetric flow ratio of oxygen-containing gas to argon for a second time period, whereby titanium that is sputtered from the target and the oxygen combine to deposit multiple layers of titanium oxide on the substrate.

DRAWINGS

These and other features, aspects, and advantages of the present invention will become better understood with reference to the following description, appended claims, and accompanying drawings, which illustrate examples and features of the present invention which may be used separately or in combination with one another, where:

DESCRIPTION

Figure 1:
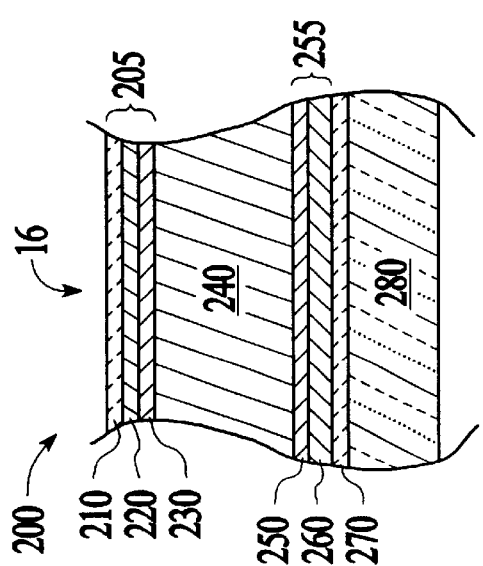
FIG. 1 is a schematic illustration of an embodiment of a stacked layer formed on a substrate.

A substrate 16, a version of which is illustrated in FIG. 1, can include a wafer 280 made of glass, polymer, metal, or semiconductor materials, such as for example, a monocrystalline silicon or gallium arsenide. Optionally, a dielectric layer 270, such as a layer of silicon oxide 270, can be formed on the wafer 280. Thereafter, a diffusion barrier layer 255 containing, for example, layers of titanium 260 and titanium nitride 250 may be formed on the dielectric layer 270. Then, a conductor layer 240 typically comprising an electrically conducting material, such as a metal-containing material, for example, an aluminum alloy containing small amounts of copper and/or silicon, or other electrically conducting compounds, is formed on the substrate 16. An anti-reflective coating 205 comprising a titanium oxide layer 210 is formed over the conductor layer 240. The titanium oxide layer 210 has a stoichiometry of $TiO_x$, with x being from about 1 to about 3, and more typically about 2. The anti-reflective coating 205 can also include other layers, for example, a layer of titanium 230, titanium nitride 220, titanium oxynitride (not shown) or silicon oxide (also not shown) formed below the titanium oxide layer 210.

Figure 2:
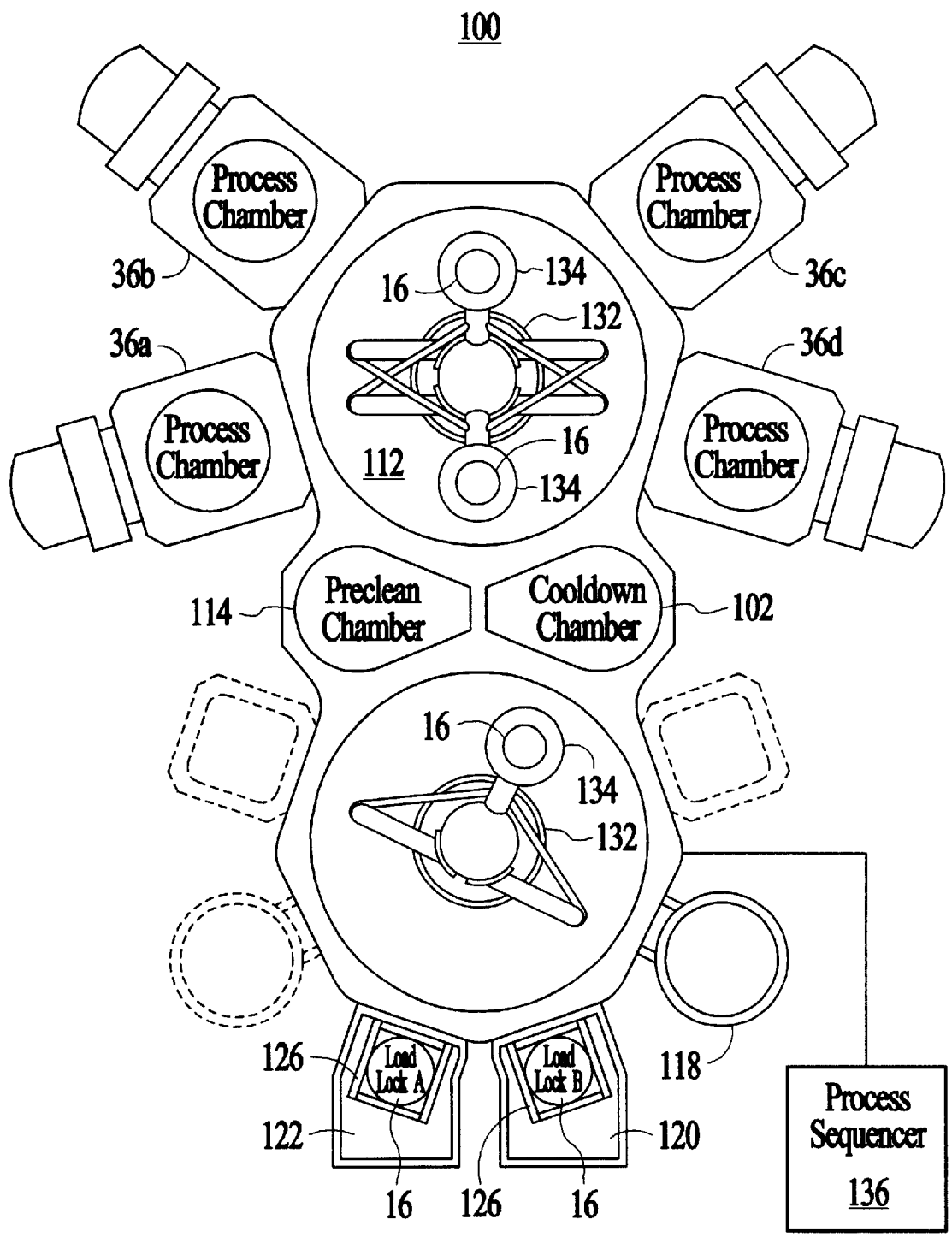
FIG. 2 is a schematic sectional top view of an embodiment of an apparatus comprising a multi-chamber platform having a number of interconnected PVD chambers mounted on the platform.

The titanium oxide layer 210 is formed in a process chamber 36a that may be part of a multi-chamber platform 100, as shown in FIG. 2. The multi-chamber platform 100 may be, for example, an "ENDURA" system commercially available from Applied Materials, Santa Clara, Calif. The particular embodiment of the platform 100 shown herein, which is suitable for processing a planar silicon wafer substrate 16, is provided only to illustrate the invention, and should not be used to limit the scope of the invention. The multi-chamber platform 100 typically comprises a cluster of interconnected chambers 36a–d, 114, 102, 118 and a substrate transport comprising robot arm mechanisms 132 to transfer substrates 16 between the chambers 36a–d, 114, 102, 118. The robot arm mechanisms 132 comprise robot arms having blades 134 that support and carry the substrates 16. Load-lock chambers 120,122 receive transport cassettes 126 containing the substrates 16. A substrate orienting and degassing chamber 118 is provided to orient the substrate 16 in preparation for processing, and to degas the substrate 16 to remove contaminants from the substrate 16 that could otherwise disrupt the high-vacuum environment in the process chambers 36a–d. A pre-clean chamber 114 may be used to clean the substrates 16 prior to any deposition step, and a cool down chamber 102 may be used to cool the substrates 16. A process sequencer 136 is provided to control the robot arm mechanisms 132, such as to order the sequence in which the robot arm mechanism 132 transfers the substrates 16 to and from the various chambers 36a–d, 114, 102, 118. Typically, the process sequencer 136 controls the robot arm mechanisms 132 to transfer a substrate 16 from one of the load lock chambers 120, 122 to the orienting and degassing chamber 118, then to the preclean chamber 114, then to one or more of the process chambers 36a–d, and afterwards to the cool down chamber 102.

Figure 3:
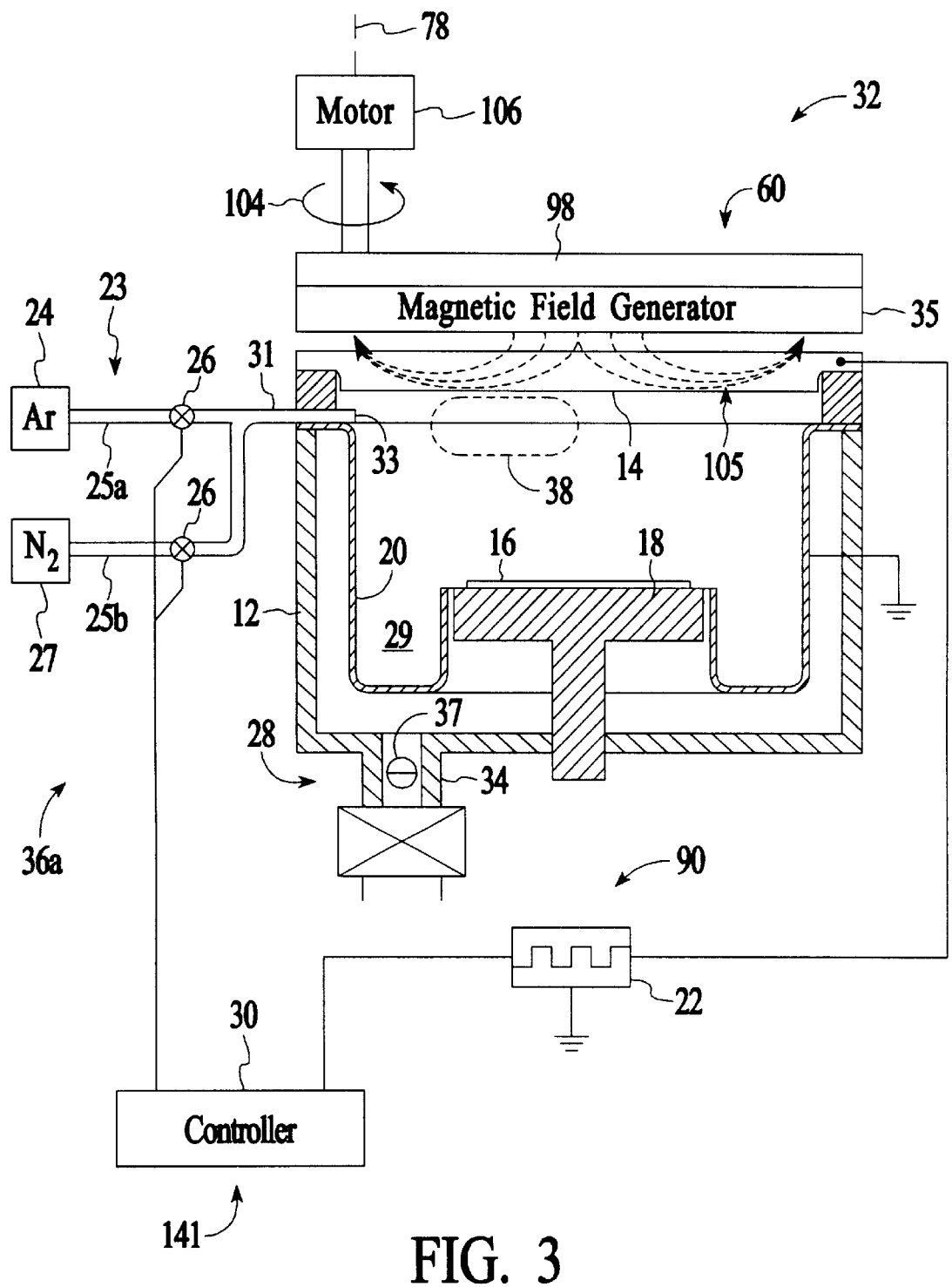
FIG. 3 is a schematic sectional side view of an embodiment of a PVD chamber suitable for depositing a titanium oxide layer.

The multi-chamber platform 100 has at least one PVD chamber 36a, as for example illustrated in FIG. 3, to sputter deposit a titanium oxide ($TiO_x$) layer 210, on the substrate 16. A substrate support 18 is provided for supporting the substrate 16 in the PVD chamber 36a. The substrate 16 is introduced into the chamber 36a through a substrate loading inlet (not shown) in a sidewall 45 of the chamber 36a and placed on the support 18. The support 18 can be lifted or lowered by support lift bellows (not shown) and a lift finger assembly (also not shown) can be used to lift and lower the substrate 16 onto the support 18 during transport of the substrate 16 into and out of the chamber 36a.

A sputtering gas supply 23 introduces sputtering gas into the chamber 36a to maintain the sputtering gas at a sub atmospheric pressure in the process zone. The sputtering gas is introduced into the chamber 36a through a gas inlet 33 that is connected via the gas inputs 25a,b to one or more gas sources 24, 27, respectively. One or more mass flow controllers 26 are used to control the flow rate of the individual gases—which may be premixed in a mixing manifold 31 prior to their introduction into the chamber 36a or which may be separately introduced into the chamber 36a. The sputtering gas typically includes a non-reactive gas, such as argon or xenon, that when energized into a plasma, energetically impinges upon and bombards the target 14 to sputter material, such as the titanium material, off from the target 14. In one version, the sputtering gas also comprises a reactive gas, such as an oxygen-containing gas, that provides oxygen species in the chamber to react with the sputtered titanium material to form a titanium oxide layer 210 on the substrate 16. A suitable composition of the sputtering gas comprises a volumetric flow ratio of oxygen-containing gas (for example oxygen) to argon of from about 4:1 to about 9:1, and in one version, about 7:1. For example, a sputtering gas having a composition of 70 sccm oxygen and 10 sccm argon may be used. Besides oxygen, the oxygen-containing gas may also be ozone or other oxygen-containing gases. Also, other compositions of sputtering gas that include other reactive gases or other types of non-reactive gases, may be used as would be apparent to one of ordinary skill in the art.

An exhaust system 28 controls the pressure of the sputtering gas in the chamber 36a and exhausts excess gas and by-product gases from the chamber 36a. The exhaust system 28 comprises an exhaust port 29 in the chamber 36a that is connected to an exhaust line 34 that leads to one or more exhaust pumps 29. A throttle valve 37 in the exhaust line 34 may be used to control the pressure of the sputtering gas in the chamber 36a. Typically, the pressure of the sputtering gas in the chamber 36a is set to sub-atmospheric levels, for example, from about 2 to about 10 mTorr.

Figure 6:
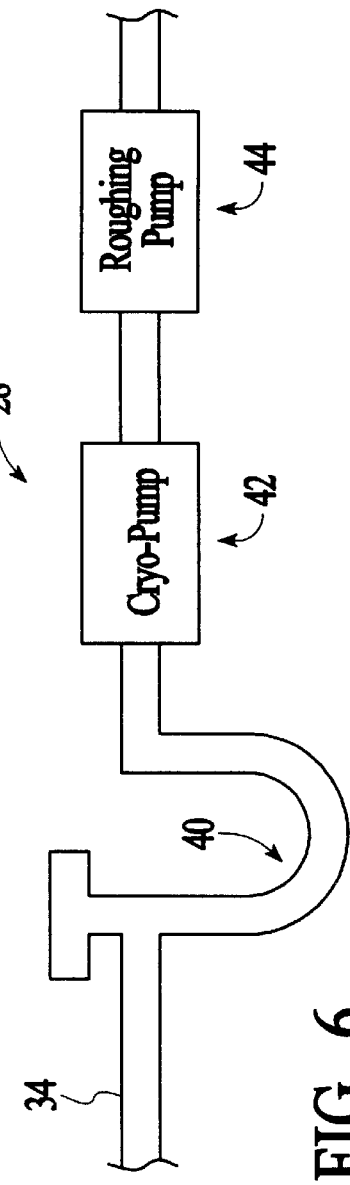
FIG. 6 is a schematic sectional side view of an exhaust system suitable for the chamber of FIG. 3.

In one version, the exhaust port 29 is connected by the exhaust line 34 to a water vapor condenser 40 that is upstream of a cryo-pump 42 and a roughing pump 44, as shown in FIG. 6. The water vapor condenser 40 is provided to condense and collect water vapor formed in the chamber 36a. A suitable water vapor condenser 40 comprises a helix that serves as a cold sink to condense the water vapor in the helix thereby avoiding damage to the downstream cryo-pump. Water vapor is formed in the chamber environment from the combination of residual hydrogen species and oxygen species from the oxygen-containing gas. The cryo-pump 42 comprises a turbo-molecular pump to pump gas out of the chamber 36a to by generate a low pressure high vacuum environment in the chamber 36a. The cryo-pump 42 is capable of high water vapor pumping speed, such as of at least about 5 times higher than that of a conventional pump. Additionally, a cryo-pump 42 may be able to exhaust the gas at pressures of at least about 5 Torr. A suitable condensor and cryo-pump assembly is commercially available from Helix Technology Corporation, Mansfield, Mass., such as their TurboPlus® Vacuum Pump. The roughing pump 44 may be a rotary vane pump that is downstream of the cryo-pump 42, and is capable of achieving a minimum vacuum of about 10 mTorr, and also optionally, a scrubber system (not shown) for scrubbing the byproduct gases formed in the chamber 36a.

The PVD chamber 36a further comprises a sputtering target 14 comprising titanium, facing the substrate 16. A collimator (not shown) may be mounted between the target 14 and the substrate support 18 if desired. The PVD chamber 36a may also have a shield 20 to protect a wall 12 of the chamber 36a from sputtered material, and typically, to also serve as an anode grounding plane. The shield 20 is electrically floating or grounded. The target 14 is electrically isolated from the chamber 36a and is connected to a voltage source, such as a pulsed DC power source 22, but which may also be other types of voltage sources. In one version, the pulsed DC power source 22, target 14, and shield 20 operate as a gas energizer 90 that is capable of energizing the sputtering gas to sputter material from the plasma. The pulsed DC power source 22 applies a pulsed DC voltage to the target 14 relative to the shield 20. The electric field generated in the chamber 36a from the voltage applied to the sputtering target 14 energizes the sputtering gas to form a plasma that sputters off the target material.

Figure 4:
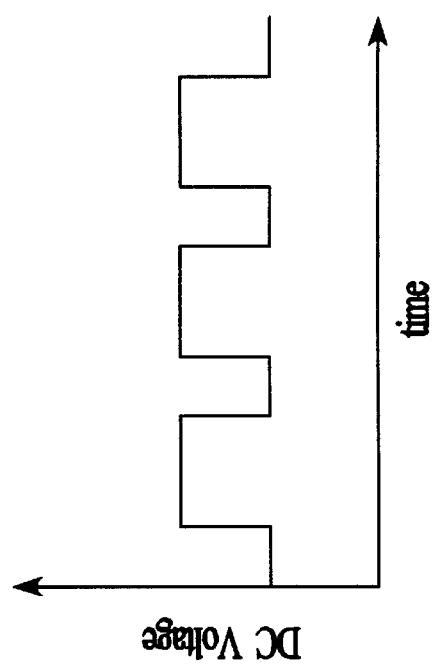
FIG. 4 is a schematic diagram of a typical DC pulsing square wave applied to the target of the chamber of FIG. 3.

The pulsed DC power source 22 applies a pulsed DC (direct current) voltage to the target 14. The pulsed DC voltage may be oscillated between negative and positive states. In one version, the pulsed DC voltage is pulsed between "on" and "off" states, as for example, shown in FIG. 4. A suitable pulsing frequency may be such that the DC voltage is off for at least about 5% of the time of each pulse cycle which is the total time period of one DC pulse. Preferably, the DC voltage is off for less than about 50% of the time of each pulse cycle, and more preferably for about 30% of the time of each pulse cycle. For example, for a total individual pulse cycle time of 10 microseconds, the pulsed DC voltage may be maintained "on" for about 7 microseconds and "off" for about 3 microseconds. The pulsed DC voltage may be pulsed at a pulsing frequency of at least about 50 kHz, and more preferably less than about 300 kHz, and most preferably about 100 kHz. A suitable DC voltage level is from about 200 to about 800 Volts.

Elemental titanium sputtered from the target 14 combines with an oxygen species in the chamber 36a to form a titanium oxide layer 210 on the substrate 16. It is believed that the pulsed DC voltage applied to the target 14 results in charge dissipation from a dielectric layer that is formed on the surface of the target 14, as a result of exposure of the titanium to the oxygen-containing gas. The titanium of the target 14 and the oxygen-containing gas react to form a thin insulative film of titanium oxide on the target surface. The insulative film does not allow accumulated charge to dissipate over time when exposed to the plasma environment containing charged ions and other species. The pulsed DC voltage alleviates this problem by maintaining "on" and "off" states during each pulse cycle. During the off period, the charge accumulated on the insulator layer that is formed on the target surface has enough time to be discharged. Hence, such charge accumulation is reduced and prevented from impeding the sputtering process. Absent the "off" portion of the pulse cycle, the insulator layer built up on the target surface and the resultant charge accumulation gradually reduces the deposition rate and may eventually even cause the plasma to be extinguished.

The chamber 36a further comprises a magnetron 32 comprising a magnetic field generator 35 that generates a magnetic field 105 near the target 14 of the chamber 36a to increase an ion density in a high-density plasma region 38 adjacent to the target 14 to improve the sputtering of the target material. In addition, an improved magnetron 32 may be used to allow sustained self-sputtering of copper or sputtering of aluminum, titanium, or other metals; while minimizing the need for non-reactive gases for target bombardment purposes, as for example, described in U.S. Pat. No. 6,183,614 to Fu, entitled "Rotating Sputter Magnetron Assembly"; and U.S. Pat. No. 6,274,008 to Gopalraja et al., entitled "Integrated Process for Copper Via Filling," both of which are incorporated herein by reference in their entirety. The magnetic field 105 extends through the substantially non-magnetic target 14 into the vacuum chamber 36a. In one version, the magnetron 32 generates a semi-toroidal magnetic field at the target 14. In one embodiment, the magnetron 32 extends horizontally from approximately a central point on the target 14 to the edge of a usable area of the target 14. In one version, the magnetron 32 comprises a motor 106 to rotate the magnetron 32 about a rotation axis 78. The motor 106 is typically attached to a magnetic yoke 98 of the magnetron 32 by a shaft 104 that extends along the rotation axis 78.

An advantage of the present process is that a number of steps for forming a stacked layer comprising the anti-reflective coating 205 may be carried out in a single PVD sputtering chamber 36a. For example, the substrate 16 need not be transferred to different chambers when forming an anti-reflective coating 205 comprising multiple layers of, for example, titanium 230, titanium nitride 220, and titanium oxide 210. In one example, prior to forming the titanium oxide layer 210, the same chamber 36a is used to deposit an elemental titanium layer 230 on the substrate 16 using a sputtering gas comprising substantially only argon, and by maintaining the target at suitable voltage levels which may include DC or RF bias levels. Also, a titanium oxy-nitride layer (not shown) may be deposited on the substrate 16 by introducing a sputtering gas comprising oxygen and nitrogen into the same chamber 36a, and maintaining suitable voltage levels to form the titanium oxy-nitride layer. Alternatively, instead of the titanium oxy-nitride layer, a titanium nitride layer 220 may also be formed by introducing a sputtering gas comprising argon and nitrogen into the same chamber 36a, and maintaining suitable DC voltage levels. Using the same chamber can reduce potential contamination of the substrate 16 that would otherwise result in the transferring steps, thereby increasing substrate yields and allowing faster production of the stacked layer 200.

Another advantage is that a stacked layer 200 fabricated according to the present invention, such as one having a diffusion barrier layer 255, a conductor layer 240, and an overlying anti-reflective coating 205 comprising a titanium layer 230 and a titanium oxide layer 210, or only a titanium oxide layer 210, provides an excellent reflectivity of less than about 7%. Such reflectivity provides superior lithographic imaging resolution during patterning of the mask over the stacked layer 200. The diffusion barrier layer 255 comprising layers of titanium 260 and titanium nitride 250 may be formed on the substrate 16 in the PVD chamber 36a or in one of the other chambers 36, by for example, using a sputtering target comprising titanium, introducing a sputtering gas comprising argon to form the titanium layer 260, or argon and nitrogen to form the titanium nitride layer 250, and energizing the gas by capacitively coupling RF energy to the gas. Then, the substrate 16 may be transferred to another PVD chamber 36b having a target comprising a conductor material, such as aluminum or copper, a sputtering gas such as argon is introduced into the chamber and energized to sputter the conductor material off from the target and onto the substrate 16. Thereafter, the substrate 16 is transferred to the chamber 36a to form an anti-reflective coating 205 comprising various layers that include a titanium oxide layer 210, on the conductor layer 240.

While a single sputtering gas composition may be used for a sputtering process, it has been advantageously discovered that in another version of the present invention, a multiple or variable sputtering gas composition may be used to form an anti-reflective coating having superior low reflectivity properties. For example, this version may be used to deposit an anti-reflective coating 205 comprising multiple layers of titanium oxide having slightly different chemical compositions. Changing the sputtering gas composition during the sputtering process has been found to deposit a sequence of layers each having a different stoichiometry, and consequently, different refractory indices. The resultant multiple refractive index layers further reduces the reflectivity of the stacked layer 200. Using a multiple or variable sputtering gas composition is not limited to forming a titanium-comprising layer, but may also be used to form other layers, such as for example, layers comprising silicon-containing materials.

In this method, a first sputtering gas comprising a first composition is initially introduced into the chamber 36a and energized to sputter off sputtering material from the sputtering target 14. The sputtering material reacts with the first sputtering gas to deposit a first layer on the substrate 16. The composition of the first layer depends on the amount of sputtered material as well as the composition of the sputtering gas. When the first sputtering gas comprises first and second gases in a first volumetric flow ratio, the first layer deposited on the substrate 16 has a corresponding first composition with a resultant first refractive index. After a desired thickness of the first layer is deposited on the substrate 16, the composition of the first sputtering gas is changed to a second sputtering gas composition, for example, to a composition having a second volumetric flow ratio of the first and second gases that is higher than the first volumetric flow ratio, for example, about 1.5 times higher. The second sputtering gas is energized to sputter off additional sputtering material from the sputtering target 14 which reacts with the second sputtering gas composition to deposit a second layer on the substrate 16. The second layer has a slightly different composition, stoichiometry, or other physical or chemical property, than the first layer. In this manner, the compositions of the first and second layers may be tailored to provide a multiple layer anti-reflective coating 205 that reduces the overall reflectivity of the substrate 16.

In one example, an anti-reflective coating 205 comprising multiple layers of titanium oxide 210 having different compositions may be formed by varying the composition of the sputtering gas from the first volumetric flow ratio of oxygen to argon to a second volumetric flow ratio of oxygen to argon. For example, a first sputtering gas having a composition of 50 sccm oxygen and 30 sccm argon may initially be used to deposit a first titanium oxide layer on the substrate 16. Thereafter, the composition of the sputtering gas may be changed to a second composition comprising 70 sccm oxygen and 10 sccm argon, to deposit a second titanium oxide layer on the substrate 16. The resultant multiple layer anti-reflective coating 205 provides a reduced reflectivity relative to a single titanium oxide layer.

While the multilayer anti-reflective coating 205 of the same material is described referring to an exemplary process of the deposition of titanium oxide, it should be understood that this process may be used to deposit other materials, such as for example, multilayer anti-reflective coatings 205 of, for example, titanium nitride 220 having sublayers with the different stoichiometric compositions, or other multilayer anti-reflective coating compositions. Thus, the scope of the present invention should not be limited to the illustrative embodiment of titanium oxide layers.

Figure 5:
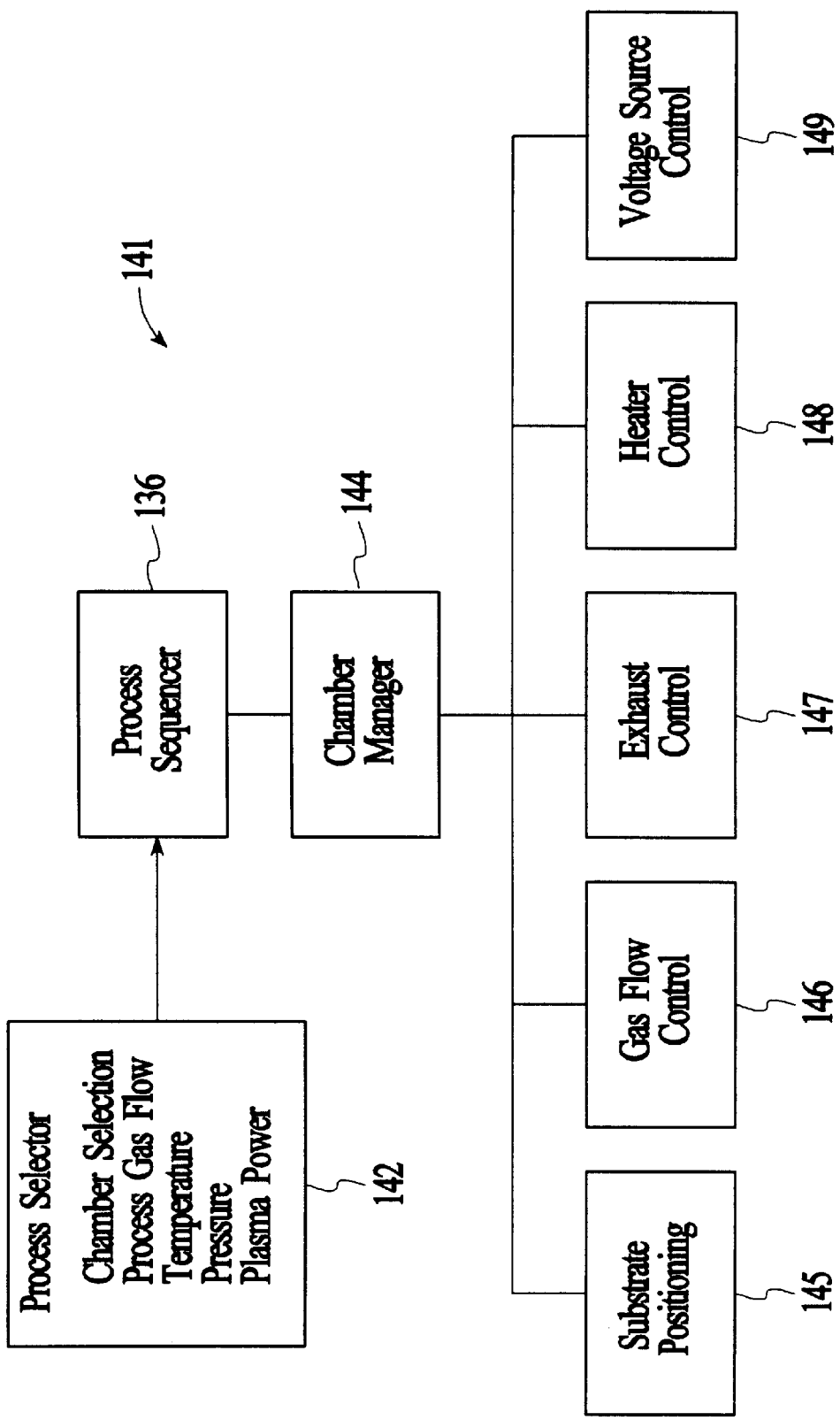
FIG. 5 is a simplified block diagram of a hierarchical control structure of an embodiment of a computer program capable of operating the PVD chamber of FIG. 3.

The PVD process of the present invention may be implemented using a computer program product 141 that includes the process sequencer 136 and that runs on a controller 30, as shown in FIG. 5, comprising a central processing unit (CPU) interconnected to a memory system with peripheral control components, such as for example a 68400 microprocessor, commercially available from Synergy Microsystems, California. The computer program code can be written in any conventional computer readable programming language, such as for example, assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

A user enters a process set and process chamber number into a process selector program code 142. The process sets are predetermined sets of process parameters necessary to carry out specified processes in a specific process chamber, and are identified by predefined set numbers. The process parameters relate to process conditions such as, for example, process gas composition and flow rates, temperature, pressure, gas energizing process conditions such as non-pulsed or pulsed DC power levels and magnetic field power levels, cooling gas pressure, and chamber wall temperature.

The process sequencer 136 comprises program code for accepting the identified process chamber 36 and set of process parameters from the process selector program code 142, and for controlling operation of the various process chambers 36a–d. Multiple users can enter process set numbers and process chamber numbers, or a user can enter multiple process set numbers and process chamber numbers, so the process sequencer 136 operates to schedule the selected processes in the desired sequence. Preferably, the process sequencer 136 includes a program code to perform the steps of (i) monitoring the operation of the process chambers 36a–d to determine if the chambers 36a–d are being used, (ii) determining what processes are being carried out in the chambers 36a–d being used, and (iii) executing the desired process based on availability of a particular process chamber 36 and type of process to be carried out. Conventional methods of monitoring the process chambers 36a–d can be used, such as polling. When scheduling which process is to be executed, the process sequencer 136 can be designed to take into consideration the present condition of the process chamber 36 being used in comparison with the desired process conditions for a selected process, or the "age" of each particular user entered request, or any other relevant factor a system programmer desires to include for determining scheduling priorities.

Once the process sequencer 136 determines which process chamber and process set combination is going to be executed next, the sequencer program code 143 causes execution of the process set by passing the particular process set parameters to a chamber manager program code 144 which controls multiple processing tasks in different process chambers 36a–d according to the process set determined by the process sequencer 136. For example, the chamber manager program code 144 comprises program code for controlling PVD process operations, within the described process chamber 36a. The chamber manager program code 144 also controls execution of various chamber component program codes or program code modules, which control operation of the chamber components necessary to carry out the selected process set. Examples of chamber component program codes are a substrate positioning program code 145, gas flow control program code 146, exhaust control program code 147, heater control program code 148, and voltage source control program code 149. Those having ordinary skill in the art would readily recognize that other chamber control program codes can be included depending on what processes are desired to be performed in the process chamber 36a.

In operation, the chamber manager program code 144 selectively schedules or calls the process component program codes in accordance with the particular process set being executed. The chamber manager program code 144 schedules the process component program codes similarly to how the sequencer program code 143 schedules which process chamber 36a–d and process set is to be executed next. Typically, the chamber manager program code 144 includes steps of monitoring the various chamber components, determining which components need to be operated based on the process parameters for the process set to be executed, and causing execution of a chamber component program code responsive to the monitoring and determining steps.

Operation of particular chamber component program codes will now be described. The substrate positioning program code 145 comprises program code for controlling chamber components that are used to transfer a substrate 16 onto the substrate support 18, and optionally, to lift the substrate 16 to a desired height in the chamber 36 to control the spacing between the substrate 16 and a target. When a substrate 16 is transferred into the process chamber 36a, the substrate support 18 is lowered to receive the substrate 16, and thereafter, the support 18 is raised to the desired height in the chamber 36a. The substrate positioning program code 145 controls movement of the support 18 in response to process set parameters related to the support height that are transferred from the chamber manager program code 144.

The gas flow program code 146 is for controlling process gas composition and flow rates. Generally, the gas conduits 34 for each of the process gases, include safety shut-off valves (not shown) that can be used to automatically or manually shut off the flow of process gas into the chamber 36a. When toxic gases are used in the process, the several safety shut-off valves are positioned on each gas conduit 34 in conventional configurations. The gas flow program code 146 controls an open/close position of the safety shut-off valves, and also ramps up/down the mass flow controllers to obtain the desired gas flow rate. The gas flow program code 146 is invoked by the chamber manager program code 144, as are all chamber component program codes, and receives from the chamber manager program code, the process parameters that are related to desired gas flow rates. Typically, the gas flow program code 146 operates by repeatedly reading the necessary mass flow controllers, comparing the readings to the desired flow rates received from the chamber manager program code 144, and adjusting the flow rates as necessary. Furthermore, the gas flow program code 146 includes steps for monitoring the gas flow rates for unsafe rates, and activating the safety shut-off valves when an unsafe condition is detected. In one version, the gas flow program code 146 operates the mass flow controllers to control the gas flow rates to provide a sputtering gas comprising first volumetric flow ratio of oxygen-containing gas to argon for a first time period, and a second volumetric flow ratio of oxygen-containing gas to argon for a second time period.

When the exhaust control program code 147 is invoked, a desired pressure level is received as a parameter from the chamber manager program code 144. The exhaust control program code 147 operates to measure the pressure in the chamber 36a by reading one or more conventional pressure nanometers (not shown) connected to the chamber 36a, compare the measure value(s) to the target pressure, obtain PID (proportional, integral, and differential) values from a stored pressure table corresponding to the target pressure, and adjust a throttle valve 37 of the exhaust 28 according to the PID values obtained from the pressure table. Alternatively, the pressure in the chamber 36a may be adjusted by regulating the opening size of the throttle valve 37 in the exhaust conduit 34 of the exhaust system 28.

The optional heater control program code 148 comprises program code for controlling the temperature of an optional heater (not shown) that may be used to heat the substrate 16. The heater control program code 148 measures temperature by measuring voltage output of a thermocouple (not shown) located in the support 18, compares the measured temperature to the set-point temperature, and increases or decreases current applied to the heater to obtain the desired ramp rate or set-point temperature. The temperature is obtained from the measured voltage by looking up the corresponding temperature in a stored conversion table, or by calculating the temperature using a fourth order polynomial. When radiant lamps are used as the heater, the heater control program code 148 gradually controls a ramp up/down of current applied to the lamp that increases the life and reliability of the lamp. Additionally, a built-in fail-safe mode can be included to detect process safety compliance, and to shut down operation of the heater if the process chamber 36a is not properly set up.

The voltage source program code 149 comprises program code for controlling a voltage source, such as the pulsed DC voltage source, to energize the sputtering gas in the chamber 36a to sputter material from the target 14. For example, the program code 149 may set the pulsed DC voltage levels applied to the target 14 and may also set the electrical state of the sidewalls 20 in the chamber 36a. Similarly to the previously described chamber component program codes, the program code 149 is invoked by the chamber manager program code 144. In operation, the program code 149 includes steps for reading both "forward" power applied to the target 14, and "reflected" power flowing through the chamber 36a. An excessively high reflected power reading indicates that the plasma has not been ignited, and the program code 149 restarts or shuts down the process. The read power levels are compared against target levels, and the current is adjusted to control the plasma.

The present invention has been described in considerable detail with reference to certain preferred versions thereof. However, other versions are possible. For example, the present invention can be used to deposit many different materials on the substrate, and is not limited to processing of semiconductor substrates. Therefore the spirit and scope of the appended claims should not be limited to the description of the preferred versions contained herein.

What is claimed is:

1. A method of depositing titanium oxide on a substrate, the method comprising:
   (a) placing a substrate in a process zone; and
   (b) setting process conditions in the process zone to deposit titanium oxide on the substrate such that the substrate has a reflectivity of less than about 7% as compared to a reflectivity of about 100% of a silicon layer, by:
      (i) applying a pulsed DC voltage to a target facing the substrate, the target comprising titanium;
      (ii) introducing a sputtering gas into the process zone, the sputtering gas comprising an oxygen-containing gas; and
      (iii) exhausting the sputtering gas.

2. A method according to claim 1 wherein (b) (i) comprises applying a pulsed DC voltage that is pulsed between a first voltage that is about 0 Volts and a second voltage that is from about 200 to about 800 Volts.

3. A method according to claim 1 wherein (b) (i) comprises applying a pulsed DC voltage that is pulsed so that the DC voltage is off for at least about 5% of the time of each pulse cycle.

4. A method according to claim 3 wherein the pulsed DC voltage is pulsed so that the DC voltage is off for less than about 50% of the time of each pulse cycle.

5. A method according to claim 1 wherein (b) (i) comprises applying a pulsed DC voltage that is pulsed at a frequency of at least about 50 kHz.

6. A method according to claim 5 wherein the pulsed DC voltage is pulsed at a frequency of less than about 300 kHz.

7. A method according to claim 1 wherein (b) (iii) comprises condensing water vapor prior to cryo-pumping the sputtering gas.

8. A method according to claim 1 wherein the titanium oxide is formed substantially without subsequently annealing the substrate in oxygen.

9. A method according to claim 1 wherein the sputtering gas comprises argon.

10. A method according to claim 9 wherein the oxygen-containing gas is oxygen.

11. A method according to claim 10 wherein the volumetric flow ratio of oxygen to argon is from about 4:1 to about 9:1.

12. A method according to claim 10 wherein the volumetric flow ratio of oxygen to argon is changed during the deposition of the titanium oxide layer.

13. A method according to claim 12 wherein the volumetric flaw ratio of oxygen to argon is changed from a first volumetric flow ratio to a second volumetric flow ratio that is higher than the first volumetric flow ratio.

14. A method of depositing a titanium-comprising anti-reflective layer on a substrate, the method comprising:
   (a) placing a substrate in a process zone to face a target comprising titanium; and
   (b) setting process conditions in the process zone to deposit the titanium-comprising antireflective layer on the substrate, the process conditions including:
      (i) applying a pulsed DC voltage to the target comprising titanium,
      (ii) introducing a sputtering gas into the process zone, and
      (iii) exhausting the sputtering gas.

15. A method according to claim 14 wherein (b)(i) comprises applying a pulsed DC voltage that is pulsed between a first voltage that is about 0 Volts and a second voltage that is from about 200 to about 800 Volts.

16. A method according to claim 14 wherein (b)(i) comprises applying a pulsed DC voltage that is pulsed so that the DC voltage is off for (1) at least about 5% of the time of each pulse cycle, and (2) less than about 50% of the time of each pulse cycle.

17. A method according to claim 14 wherein (b)(i) comprises applying a pulsed DC voltage that is pulsed at a frequency of at least about 50 kHz and less than about 300 kHz.

18. A method according to claim 14 wherein the titanium-comprising antireflective coating comprises one or more of titanium, titanium oxide, titanium nitride, and titanium oxy-nitride.

19. A method according to claim 14 wherein (b)(iii) comprises condensing water vapor prior to cryo-pumping the sputtering gas.

20. A method according to claim 14 wherein in (b)(ii) the sputtering gas comprise oxygen.

21. A method according to claim 20 wherein the sputtering gas comprises argon.

22. A method according to claim 20 wherein the sputtering gas comprises nitrogen.

23. A method of fabricating a substrate, the method comprising:
   (a) forming a conductor layer on a substrate;
   (b) placing the substrate in a process zone to face a target comprising titanium; and
   (c) setting process conditions in the process zone to deposit an anti-reflective coating comprising titanium oxide on the conductor layer of the substrate by:
      (i) applying a pulsed DC voltage to the target comprising titanium,
      (ii) introducing a sputtering gas into the process zone, the sputtering gas comprising an oxygen-containing gas and a non-reactive gas, and
      (iii) exhausting the sputtering gas.

24. A method according to claim 23 further comprising forming a diffusion barrier layer on the substrate prior to (a).

25. A method according to claim 23 wherein (c)(i) comprises applying a pulsed DC voltage that is pulsed between a first voltage that is about 0 Volts and a second voltage that is from about 200 to about 800 Volts.

26. A method according to claim 23 wherein (c)(i) comprises applying a pulsed DC voltage that is pulsed so that the DC voltage is off for (1) at least about 5% of the time of each pulse cycle, and (2) less than about 50% of the time of each pulse cycle.

27. A method according to claim 23 wherein (c)(i) comprises applying a pulsed DC voltage that is pulsed at a frequency of at least about 50 kHz and less than about 300 kHz.

28. A method according to claim 23 wherein the anti-reflective coating comprises one or more layers of titanium oxide or titanium oxy-nitride.

29. A method according to claim 23 wherein (c)(iii) comprises condensing water vapor prior to cryo-pumping the sputtering gas.

30. A method according to claim 23 wherein in (c)(ii) the oxygen-containing gas is oxygen.

31. A method according to claim 30 wherein in (c)(ii) the non-reactive gas comprises argon.

32. A method according to claim 31 wherein the volumetric flow ratio of oxygen to argon is from about 4:1 to about 9:1.

33. A method of depositing a titanium-comprising anti-reflective coating on a substrate, the method comprising:
(a) placing the substrate in a process zone so that the substrate faces a target comprising titanium;
(b) applying a pulsed DC voltage to the target, the pulsed DC voltage having a frequency of from about 50 kHz to about 300 kHz and being pulsed so that the voltage is off from about 5% to about 50% of the time of each pulse cycle;
(c) introducing a sputtering gas into the chamber, the sputtering gas comprising one or more of oxygen, argon and nitrogen; and
(d) exhausting the sputtering gas.

34. A method according to claim 33 wherein in (c) the volumetric flow ratio of oxygen to argon is changed during the deposition of the titanium oxide layer from a first volumetric flow ratio to a second volumetric flow ratio that is higher than the first volumetric flow ratio.

35. A method according to claim 34 wherein the second volumetric flow ratio is at least about 1.5 times higher than the first volumetric flow ratio.

36. A method according to claim 34 wherein the titanium-comprising anti-reflective coating comprises one or more of titanium, titanium oxide, titanium nitride, and titanium oxynitride.

* * * * *